(12) United States Patent
Sato et al.

(10) Patent No.: US 12,149,389 B2
(45) Date of Patent: Nov. 19, 2024

(54) ISOLATOR WITH FORWARD AND RETURN PATHS

(71) Applicant: Renesas Electronics America Inc., Milpitas, CA (US)

(72) Inventors: Tetsuo Sato, San Jose, CA (US); Jiang Chen, Cupertino, CA (US); Qiu Sha, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 10 days.

(21) Appl. No.: 18/155,999

(22) Filed: Jan. 18, 2023

(65) Prior Publication Data

US 2024/0243954 A1 Jul. 18, 2024

(51) Int. Cl.
*H04L 27/06* (2006.01)
*H01L 23/66* (2006.01)
*H04L 25/02* (2006.01)

(52) U.S. Cl.
CPC .............. *H04L 27/06* (2013.01); *H01L 23/66* (2013.01); *H04L 25/0266* (2013.01); *H01L 2223/6611* (2013.01)

(58) Field of Classification Search
CPC .............. H01L 23/66; H01L 2223/6611; H04L 25/0266; H04L 27/06
See application file for complete search history.

(56) References Cited

U.S. PATENT DOCUMENTS

| | | | |
|---|---|---|---|
| 10,097,338 B1* | 10/2018 | Ng | G05F 1/561 |
| 2018/0191334 A1* | 7/2018 | Sadasivam | H04L 25/0266 |
| 2019/0372749 A1* | 12/2019 | Ikeda | G06F 1/12 |
| 2023/0062820 A1* | 3/2023 | Gualco | G01R 19/0092 |

* cited by examiner

*Primary Examiner* — David B Lugo
(74) *Attorney, Agent, or Firm* — SCULLY, SCOTT, MURPHY & PRESSER, P.C.

(57) ABSTRACT

Systems, devices, and methods for isolating digital signals are described. A carrier signal can be modulated using a first signal to generate a first modulated signal. The carrier signal and the first modulated signal can be transmitted through a forward path in an isolation barrier, where transmitting the carrier signal through the isolation barrier can transform the carrier signal into a delayed carrier signal. The first modulated signal can be demodulated to recover the first signal. The delayed carrier signal can be modulated using a second signal to generate a second modulated signal. The delayed carrier signal and the second modulated signal can be transmitted through a return path in the isolation barrier, where the return path and the forward path has opposite directions.

20 Claims, 7 Drawing Sheets

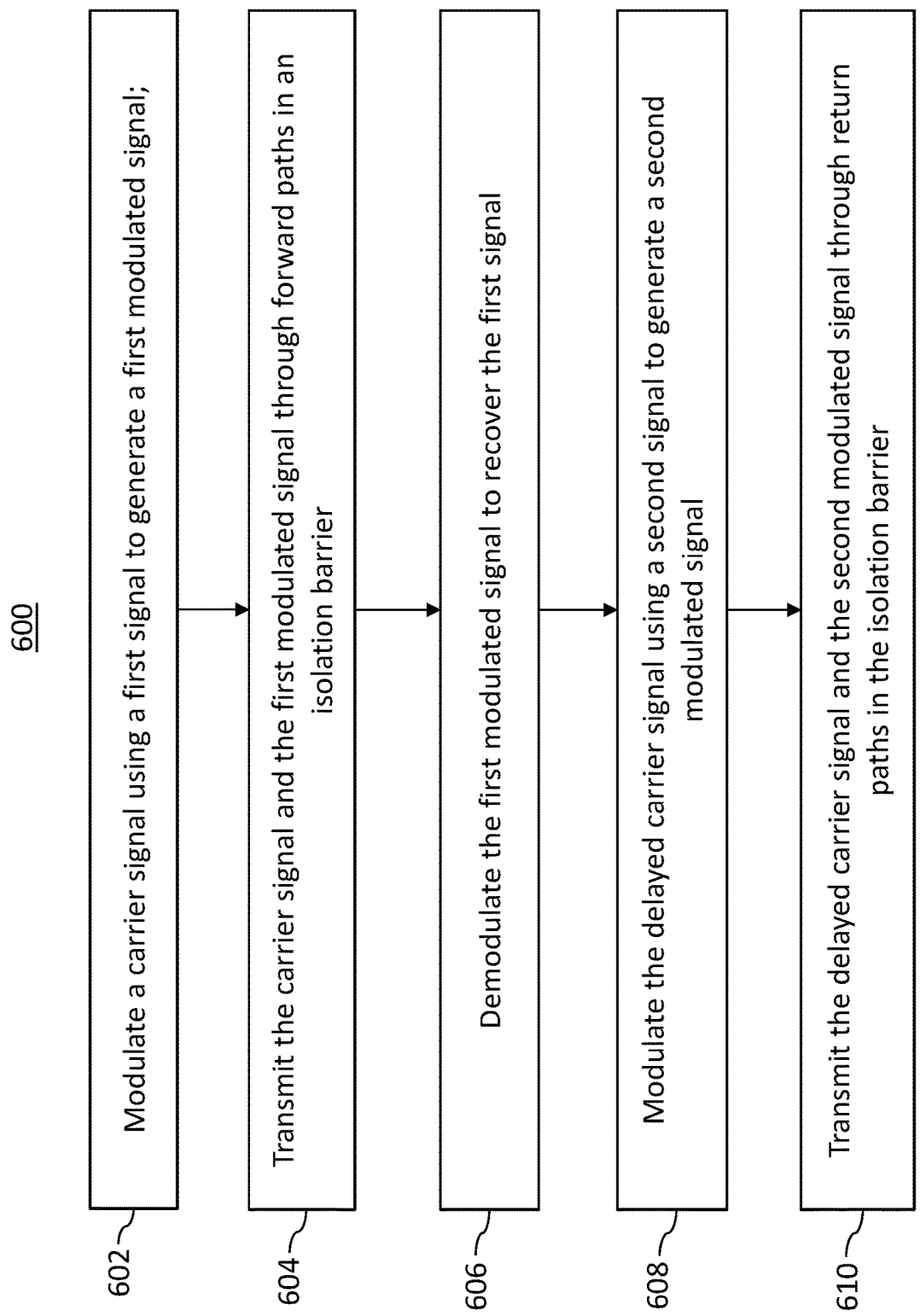

ISOLATOR WITH FORWARD AND RETURN PATHS

BACKGROUND OF THE SPECIFICATION

The present disclosure relates in general to semiconductor devices. More specifically, the present disclosure relates to an isolator system including forward and return paths.

Digital isolators are integrated devices used for isolating digital signals and transfer digital communication across an isolation barrier. An input signal can be modulated through a transmitter and then passed through the isolation barrier to a receiver. The modulated signal can be coupled to the isolation barrier and appears in attenuated form on the receiver side. A demodulator in the receiver can regenerate the original input signal. The isolation barrier can be implemented by, for example, at least one transformer, or capacitor.

SUMMARY

In one embodiment, a semiconductor device for isolating digital signals is generally described. The semiconductor device can include a first chip, a second chip, and an isolation barrier. The first chip can be configured to modulate a carrier signal, using a first signal designated for the second chip, to generate a first modulated signal. The first chip can be further configured to transmit the carrier signal and the first modulated signal to the second chip through the isolation barrier. The second chip can be configured to receive the carrier signal and the first modulated signal. The carrier signal can be received as a delayed carrier signal. The second chip can be further configured to demodulate the first modulated signal to recover the first signal. The second chip can be further configured to modulate the delayed carrier signal, using a second signal designated for the first chip, to generate a second modulated signal. The second chip can be further configured to transmit the delayed carrier signal and the second modulated signal to the first chip through the isolation barrier.

In one embodiment, a method for transmitting a signal is generally described. The method can include modulating a carrier signal using a first signal to generate a first modulated signal. The method can further include transmitting the carrier signal and the first modulated signal through a forward path in an isolation barrier, where transmitting the carrier signal through the isolation barrier can transform the carrier signal into a delayed carrier signal. The method can further include demodulating the first modulated signal to recover the first signal. The method can further include modulating the delayed carrier signal using a second signal to generate a second modulated signal. The method can further include transmitting the delayed carrier signal and the second modulated signal through a return path in the isolation barrier, where the return path and the forward path has opposite directions.

In one embodiment, a semiconductor device for isolating digital signals is generally described. The semiconductor device can include a first device, a second device, and isolators. The isolator can include a first chip, a second chip, and an isolation barrier. The first chip can be configured to receive a first signal from the first device, wherein the first signal is designated for the second device. The first chip can be further configured to modulate a carrier signal using the first signal to generate a first modulated signal. The first chip can be further configured to transmit the carrier signal and the first modulated signal to the second chip through the isolation barrier. The second chip can be configured to receive the carrier signal and the first modulated signal, where the carrier signal can be received as a delayed carrier signal. The second chip can be further configured to demodulate the first modulated signal to recover the first signal. The second chip can be further configured to receive a second signal from the second device, wherein the second signal is designated for the first device. The second chip can be further configured to modulate the delayed carrier signal using the second signal to generate a second modulated signal. The second chip can be further configured to transmit the delayed carrier signal and the second modulated signal to the first chip through the isolation barrier. The first chip can be further configured to receive the delayed carrier signal as a twice delayed carrier signal. The first chip can be further configured to demodulate the twice delayed carrier signal to recover the second signal. The first chip can be further configured to transmit the second signal to the first device.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 6 illustrates a flow diagram relating to operations of an isolator with forward and return paths in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
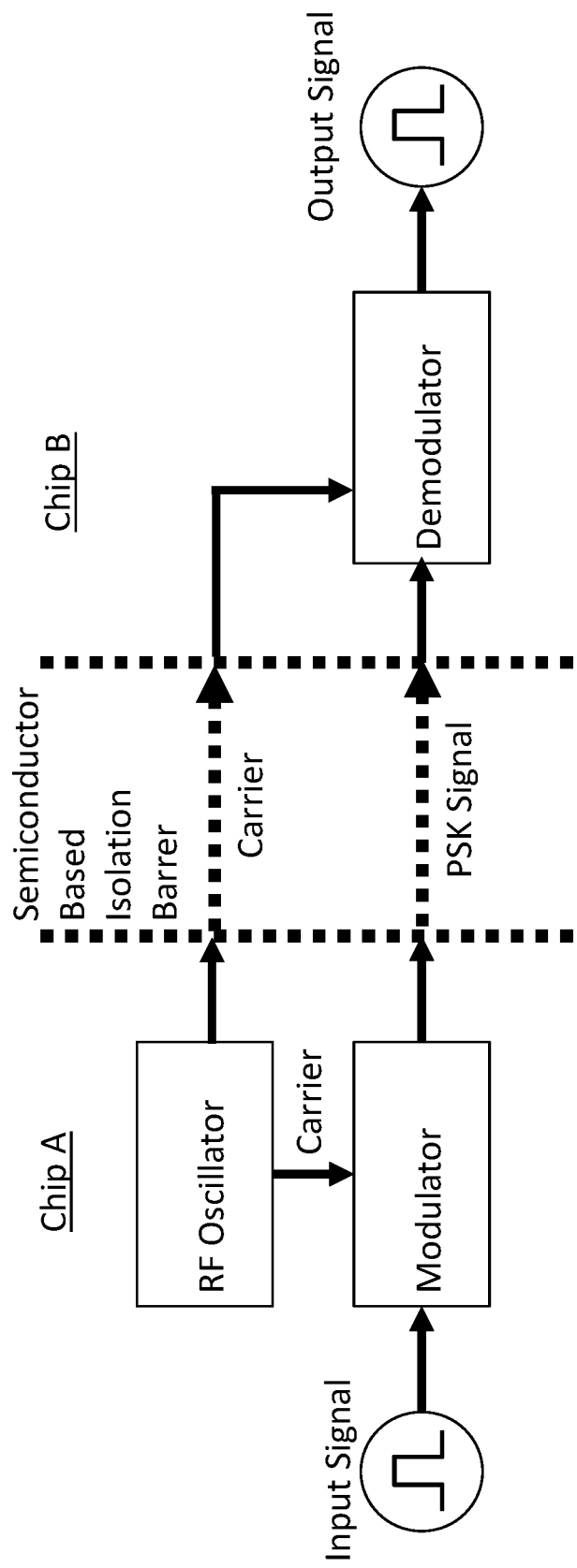
FIG. 1A is a diagram showing a conventional isolator.

FIG. 1A is a diagram showing a conventional isolator. The conventional isolator circuit shown in FIG. 1A can be a high voltage isolator for signal transfer between circuit blocks which have different reference voltage levels. In an aspect, the conventional isolator can be a part of a system integrated circuit (IC) to connect low voltage control stage with high voltage driver stage. Such system IC can typically use silicon IC process, thus the conventional isolator uses capacitive or inductive coupling.

The conventional isolator can be implemented using various isolator architectures, such as a phase-shift keying (PSK) architecture shown in FIG. 1A. The conventional isolator in FIG. 1A can include a chip A and a chip B isolated by a semiconductor-based isolation barrier implemented by, for example, a capacitor or a transformer, without direct current (DC) connection. Chip A can receive an input signal and a modulator (e.g., a phase-shift keying (PSK) modulator) in chip A can use the input signal to modulate a carrier signal generated from a radio frequency (RF) oscillator of chip A. Under PSK modulation, the input signal can modulate the carrier as a phase shift, 0 degree or 180 degrees, to represent binary zero or binary one, respectively. The modulation of the carrier signal can address challenges such as RF noise, common mode transient immunity (CMTI), and high bit rate transfer. The modulated PSK signal and the carrier signal can pass through a semiconductor-based isolation barrier to chip B. The isolation barrier can apply delays the PSK signal and delays the carrier signal. A demodulator (e.g., PSK demodulator) in chip B can use, the delayed PSK signal and delayed carrier to generate recovered signal and remove the carrier leaking signal from recovered signal, and the recovered signal can be outputted as an output signal.

If the conventional system in FIG. 1A has no carrier path from Chip A to Chip B, and Chip B has carrier re-generation block such as Costas Loop block, it works as demodulator in system. However it has little different characters as an isolator. If exposed to relatively strong RF signal, such as RF noise from a wireless base station, the carrier re-generation case, the demodulator output signal will not be determined as fixed level. However, in the carrier path exist system case, the strong RF noise will swap carrier and PSK signals both to same RF noise, meaning exclusive OR base demodulator output becomes low level (e.g., logic low) because input is only (1,1) or (0,0). If the output level is known to the system, the system can be designed to be disabled in heavy noise condition. Also, carrier path system can apply spectrum spread system for better electromagnetic interference (EMI) for RF products.

Figure 1B:
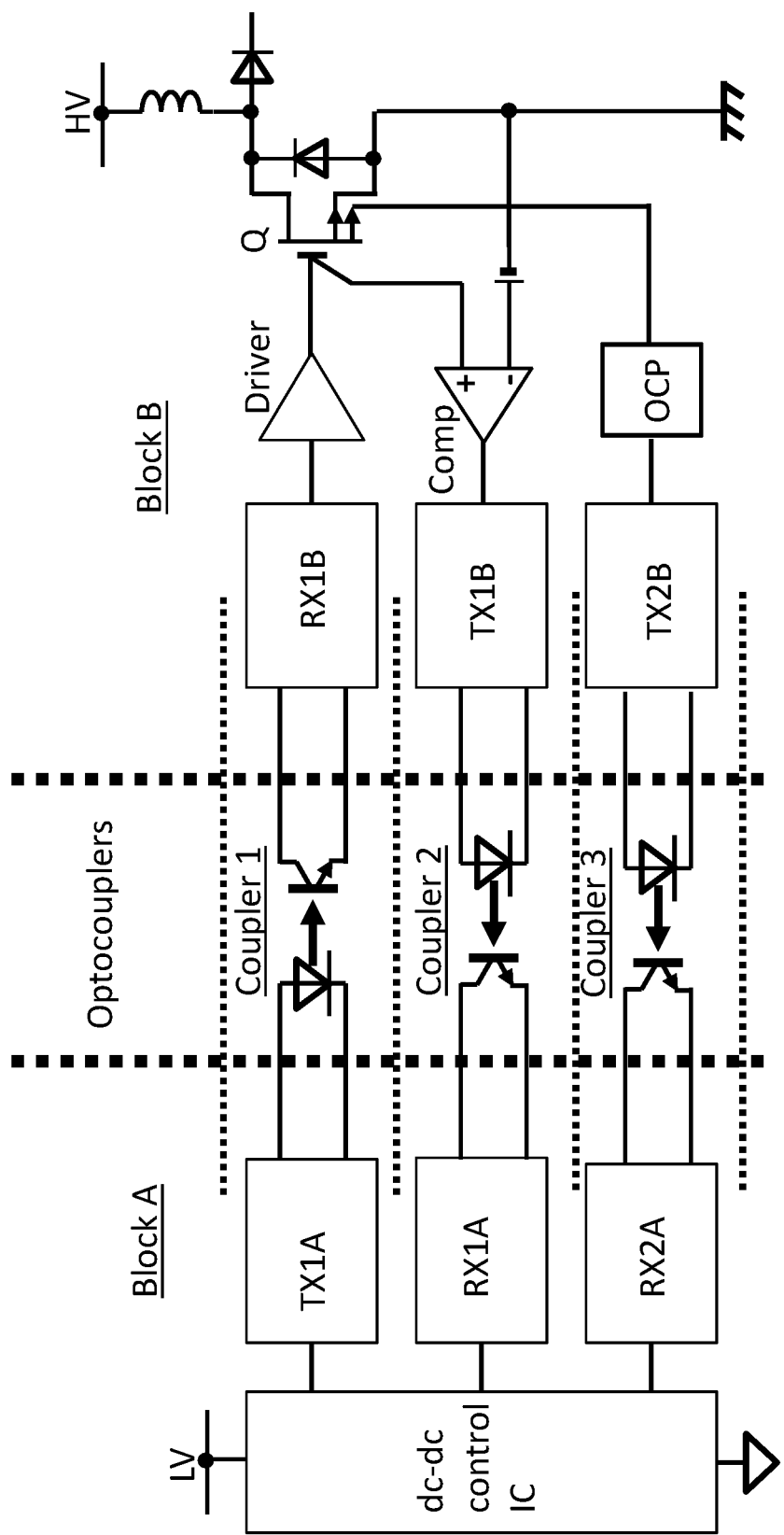
FIG. 1B is a diagram showing an application that utilizes conventional isolators.

FIG. 1B is a diagram showing an application that utilizes a conventional isolator (Optocoupler) with one or more forward paths and return paths. In an aspect, some applications (e.g., high power applications) can include one or more return paths to transmit signals from Block B to Block A. By way of example, high horsepower motor may need a variety of feedback signals such as rotor position sensing information, driving current information for speed, torque control, warning or failure report relating to driver temperature, overcurrent, or other types of feedback information. In another example, high voltage DC-DC systems may utilize return paths from Block B to Block A, such as feedback voltage for output voltage control, warning or protection information such as over voltage protection, over current protection, over temperature protection, for operation safety.

A DC-DC upconverter application utilizing conventional isolators (Optocouplers) with one forward path and two return paths is shown in FIG. 1B. The one forward path can utilize a first isolator (Coupler 1) and can have signals being transmitted from a transmitter TX1A in Block A to a receiver RX1B in Block B. A first return path can utilize a second isolator (Coupler 2) and can have signals being transmitted from a receiver TX1B in Block B to a receiver RX1A in Block A. A second return path can utilize a third isolator (Coupler 3) and can have signals being transmitted from a transmitter TX2B in Block B to a receiver RX2A in Block A. The first, second, and third isolators can function as signal transporters.

A DC-DC control IC can generate a pulse width modulation (PWM) signal having proper frequency and duty cycle. Transmitter TX1A in Block A can generate PWM signal and can provide the signal to receiver RX1B in Block B through a first isolator. Transmitter TX1A in Block A can generate a PWM signal to receiver RX1B in Block B through the first isolator. Receiver RX1B can regenerate the PWM signal, and provide the PWM signal to a driver to switch a metal-oxide-semiconductor field-effect transistor (MOSFET) labeled as Q.

In an aspect, for safe operations, the system can monitor gate-source voltage Vgs of MOSFET Q, and can monitor current from MOSFET Q. The monitored Vgs can be fed back to transmitter TX1B, through a comparator (comp) in Block B. Transmitter TX1B in Block B can generate a signal that can be represented with the monitored Vgs, and this signal can be provided to receiver RX1A in Block A through the second isolator. Receiver RX1A can reproduce the signal received from TX1B in Block B and recover Vgs, and provide Vgs to the DC-DC control IC.

The monitored current can be fed back to transmitter TX2B, through an overcurrent protection circuit (OCP), in Block B. Transmitter TX2B in Block B can generate a signal that can be represented with the monitored current, and this signal can be provided to receiver RX2A in Block A through the third isolator. Receiver RX2A can reproduce the signal received from TX2B in Block B and recover the monitored current, and provide the monitored current to the DC-DC control IC. By using multiple isolators (couplers), the conventional system shown in FIG. 1B can achieve isolated ground between a high voltage output stage (HV) and a low voltage input stage (LV).

To implement return paths from Block B to Block A, using optocouplers either analogue signal or analog-to-digital converted digital signal will be transferred (e.g., the Vgs and monitored current) to transmit the feedback data to Block A in a return path. The optocoupler can work well for feedforward and feedback paths system. However, each optocoupler's size is relatively large and less reliable of temperature and environment (e.g., dusty) conditions. Under the situation, compact size, higher reliable, system IC friendly solution will be expected.

Figure 2:
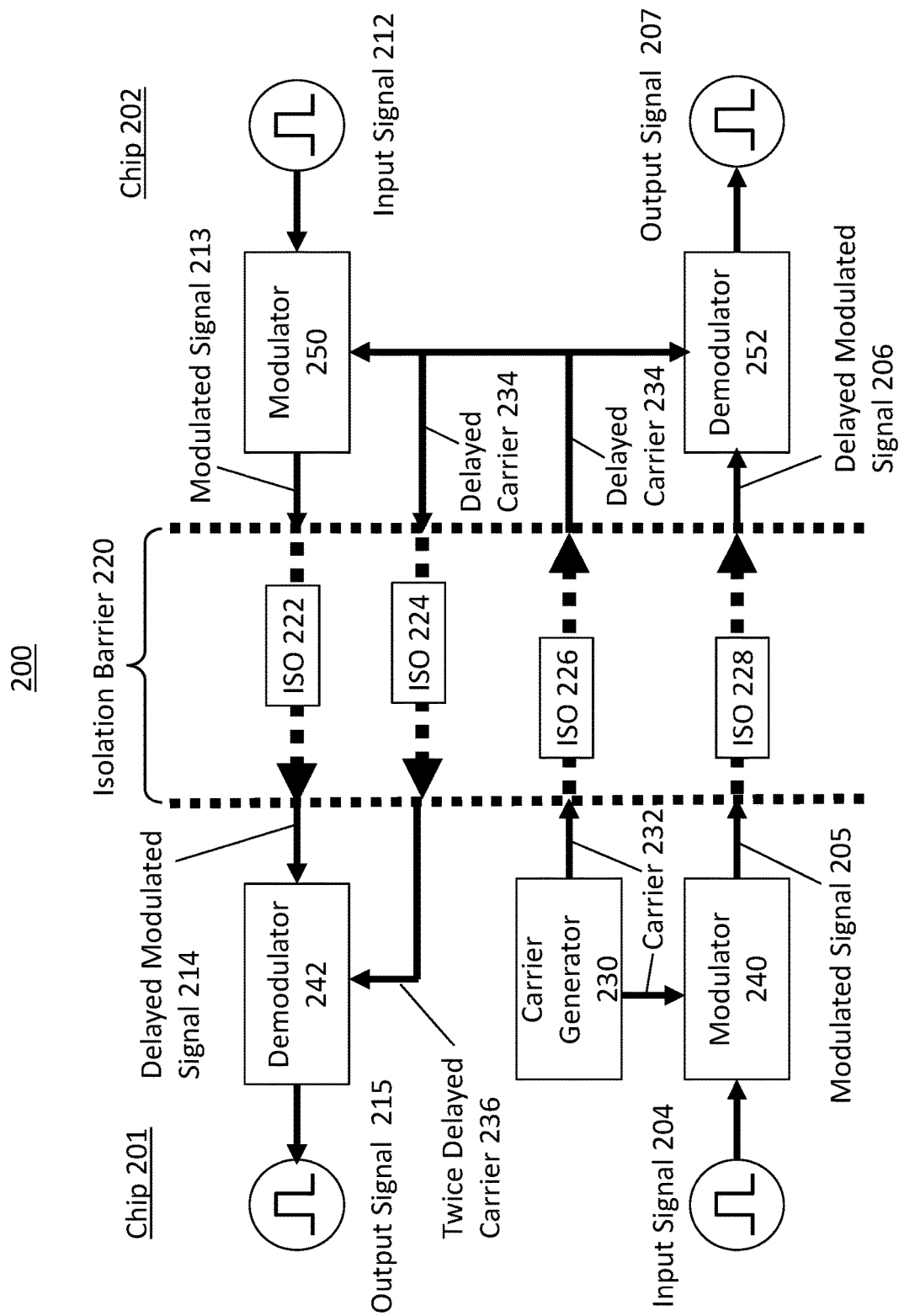
FIG. 2 is an example diagram of an isolator with forward and return paths in one embodiment.

FIG. 2 is an example diagram of an isolator with forward and return paths in one embodiment. An apparatus 200 is shown in FIG. 2. Apparatus 200 can include a semiconductor device or chip, a plurality of analog and digital circuit components, and interfaces. Apparatus 200 can implement a bi-directional digital isolator that can exchange digital signals between two isolated devices through an isolation barrier. In one embodiment, apparatus 200 can be an isolator fabricated as a system IC.

Apparatus 200 can include a first chip 201 (labeled as chip 201 in FIG. 2), a second chip 202 (labeled as chip 202 in FIG. 2) and an isolation barrier. Each one of chips 201, 202 can be an individual integrated circuit (IC) or semiconductor chip. First chip 201 and second chip 202 can be isolated from one another (e.g., no direct or physical connection). Isolation barrier 220 can be situated between first chip 201 and second chip 202 to isolate first chip 201 and second chip 202. Isolation barrier 220 can include a plurality of isolation components or isolation elements 222, 224, 226, 228 that can be, for example, capacitors or transformers. Although four isolation elements are shown in FIG. 2, isolation barrier 220 can include an arbitrary number of isolation elements.

First chip 201 and second chip 202 can exchange digital signals with one another using the isolation elements in isolation barrier 220 (e.g., apparatus 200 being a capacitive isolator). If the isolation elements are capacitors, the capacitors can filter out direct current (DC) components of the signal being transmitted from first chip 201 to second chip 202, or from second chip 202 to first chip 201, and the low frequency alternating current (AC) components of the signal are attenuated. If the isolation elements are transformers (e.g., apparatus 200 being an inductive isolator), the transformers can facilitate signal transmission using inductive coupling.

First chip 201 can include at least one digital signal modulator (e.g. a modulator 240) and at least one digital demodulator (e.g., a demodulator 242). Modulator 240 can be a digital modulator configured to perform digital modulation and demodulator 242 can be a digital demodulator configured to demodulate digitally modulated signals. Some examples of digital modulation can include, but not limited to PSK, binary phase shift key (BPSK), quadrature phase shift key (QPSK), differential quadrature phase shift key (D-QPSK), frequency shift key (FSK), M-ary phase shift key (M-PSK), quadrature amplitude modulation (QAM), amplitude and phase shift key (APSK), code-division multiple access (CDMA), etc. In one embodiment, modulator 240 can be a PSK modulator and demodulator 242 can be a PSK demodulator. In one embodiment, first chip 201 can further include a carrier generator 230 configured to generate a carrier signal 232 (labeled as carrier 232 in FIG. 2). In some embodiments, carrier generator 230 can be located in a device external to apparatus 200. In one embodiment, carrier generator 230 can be a radio frequency (RF) oscillator. In another embodiment, carrier generator 230 can be a voltage controlled oscillator. Carrier signal 232 can be a signal (e.g., a sinusoidal) that can be modulated or modified with an information-bearing signal for the purpose of conveying information.

First chip 201 can receive an input signal 204. Input signal 204 can be a digital signal, such as a pulse width modulation (PWM) signal or other types of digital signal. Input signal 204 can be a signal designated to be transmitted from first chip 201 to second chip 202. Carrier generator 230 can transmit carrier signal 232 to modulator 240. Modulator 240 can be configured to modulate carrier signal 232 using input signal 204, where the modulated carrier signal is labeled as modulated signal 205 in FIG. 2. Modulated signal 205 can encode data or information represented by input signal 204.

Carrier generator 230 can transmit carrier signal 232 to second chip 202 through isolation barrier 220. Modulator 240 can transmit modulated signal 205 to second chip 202 through isolation barrier 220. In one embodiment, carrier generator 230 and modulator 240 can transmit signals to second chip 202 using individual isolator elements in isolation barrier 220. By way of example, carrier generator 230 can transmit carrier signal 232 to second chip 202 through isolation element 226. Modulator 240 can transmit modulated signal 205 to second chip 202 through isolation element 228.

Isolation barrier 220 can apply a delay D to carrier signal 232, and can apply the same delay D to modulated signal 205. In response to the applied delay, second chip 202 can receive carrier signal 232 as a delayed carrier signal 234 (labeled as delayed carrier 234 in FIG. 2), and can receive modulated signal 205 as a delayed modulated signal 206. Second chip 202 can include at least one digital signal modulator (e.g. a modulator 250) and at least one digital demodulator (e.g., a demodulator 252). Demodulator 252 can receive delayed carrier signal 234 and delayed modulated signal 206. Demodulator 252 can be configured to use delayed carrier signal 234 to demodulate delayed modulated signal 206 to recover input signal 204. Demodulator 252 can output the recovered signal as an output signal 207, where output signal 207 can be a copy of input signal 204 and can represent the same data or information as input signal 204. Modulator 250 can be a digital modulator configured to perform digital modulation and demodulator 252 can be a digital demodulator configured to demodulate digitally modulated signals. Some examples of digital modulation can include, but not limited to PSK, binary phase shift key (BPSK), quadrature phase shift key (QPSK), differential quadrature phase shift key (D-QPSK), frequency shift key (FSK), M-ary phase shift key (M-PSK), quadrature amplitude modulation (QAM), amplitude and phase shift key (APSK), code-division multiple access (CDMA), etc. In one embodiment, modulator 250 can be a PSK modulator and demodulator 252 can be a PSK demodulator.

In one embodiment, second chip 202 can include a first internal signal or current path (e.g., path within second chip 202) that connects isolation element 226 to modulator 250, and a second internal signal path that connects isolation element 226 to isolation element 224. The first internal signal path allows second chip 202 to receive delayed carrier signal 234 and forward delayed carrier signal 234 to modulator 250. The second internal signal path allows second chip 202 to receive delayed carrier signal 234 and return delayed carrier signal 234 to first chip 201.

Second chip 202 can receive an input signal 212. Input signal 212 can be a digital signal. Input signal 212 can be a signal designated to be transmitted from second chip 202 to first chip 201. Modulator 250 can be configured to modulate delayed carrier signal 234 using input signal 212, where the modulated delayed carrier signal is labeled as modulated signal 213 in FIG. 2. Modulated signal 213 can encode data or information represented by input signal 212.

Second chip 202 can transmit delayed carrier signal 234 to first chip 201 through isolation barrier 220. Modulator 250 can transmit modulated signal 213 to first chip 201 through isolation barrier 220. In one embodiment, second chip 202 and modulator 250 can transmit signals to first chip 201 using individual isolator elements in isolation barrier 220. By way of example, second chip 202 can transmit delayed carrier signal 234 to first chip 201 through isolation element 224. Modulator 250 can transmit modulated signal 213 to first chip 201 through isolation element 222.

Isolation barrier 220 can apply the delay D to delayed carrier signal 234, and can apply the same delay D to modulated signal 213. In response to the applied delay, first chip 201 can receive delayed carrier signal 234 as a twice delayed carrier signal 236 (labeled as twice delayed carrier 236 in FIG. 2), and can receive modulated signal 213 as a delayed modulated signal 214. Demodulator 242 can receive twice delayed carrier signal 236 and delayed modulated signal 214. Demodulator 242 can be configured to use twice delayed carrier signal 236 to demodulate delayed modulated signal 214 to recover input signal 212. Demodulator 242 can output the recovered signal as an output signal 215, where output signal 215 can be a copy of input signal 212 and can represent the same data or information as input signal 212.

By having internal signal paths to provide delayed carrier signal 234 to modulator 250 and to return delayed carrier signal 234 to first chip 201, second chip 202 can re-use carrier signal 232 (e.g., delayed carrier signal 234 being the delayed version of carrier signal 232) for transmitting signals in return paths to first chip 201 (e.g., from second chip 202 to first chip 201). Re-using carrier signal 232 can avoid a need to have circuits, such as phase-lock-loop (PLL) circuits, for generating carrier signals in second chip 202.

Apparatus 200, by re-using carrier signal 232, can provide high noise immunity, high response time (e.g., zero lock-in time), and good phase matching.

Further, demodulator 242 in first chip 201 needs a carrier signal with proper delay to demodulate modulated signals from second chip 202. In other words, demodulator 242 in first chip 201 needs a carrier signal that phase matches with the modulated signal to demodulate the modulated signal. Carrier signal 232 and delayed modulated signal 214 are not phase matched, and thus demodulator 242 cannot use carrier signal 232 to demodulate delayed modulated signal 214. However, twice delay carrier signal 236 and delayed modulated signal 214 are phased matched, and hence demodulator 242 can use twice delayed carrier signal 236 to demodulate delayed modulated signal 214.

Figure 3:
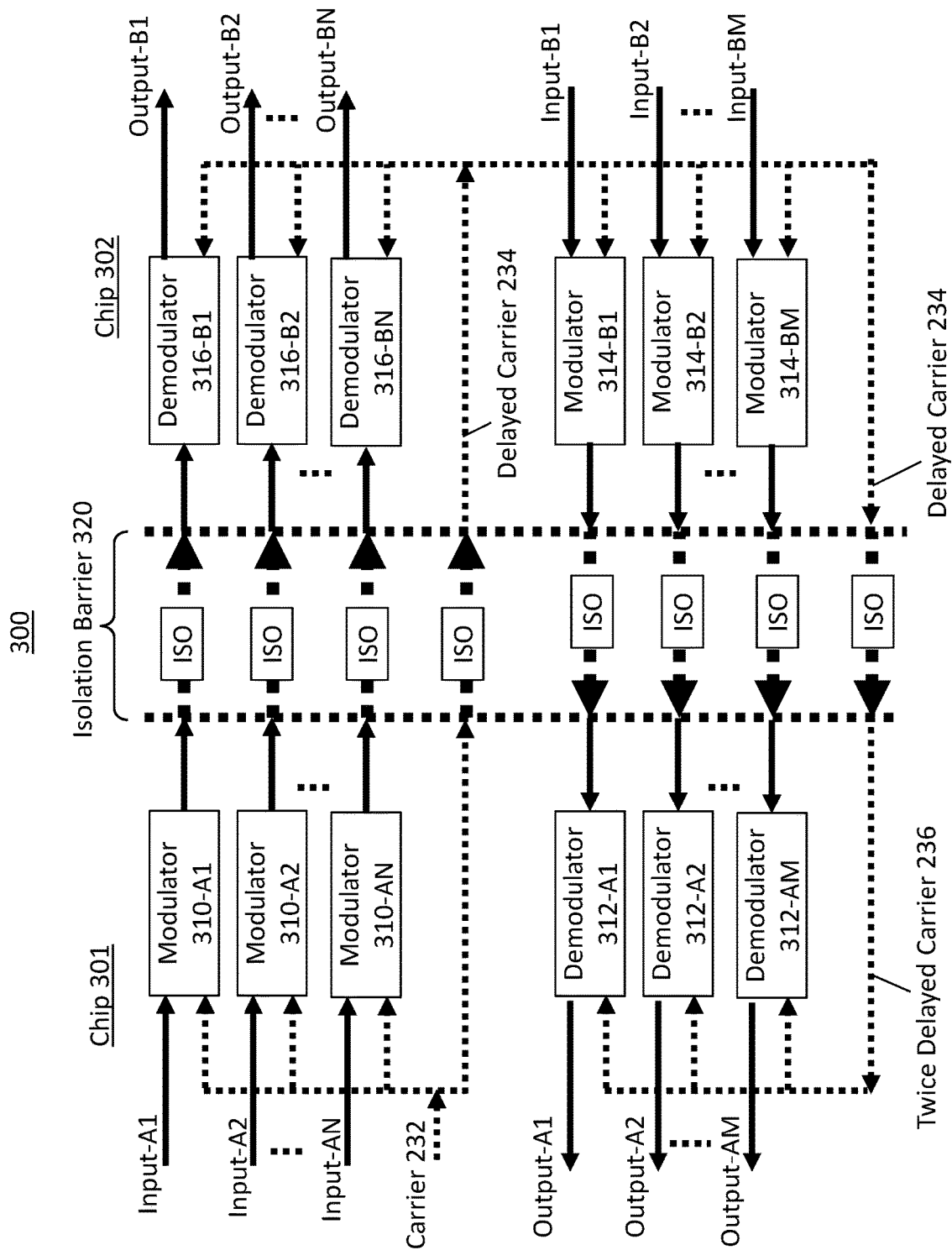
FIG. 3 is another example diagram of an isolator with forward and return paths in one embodiment.

FIG. 3 is another example diagram of an isolator with forward and return paths in one embodiment. An apparatus 300 is shown in FIG. 3. In one embodiment, apparatus 300 can be apparatus 200, shown in FIG. 2, with additional components. Apparatus 300 can include a semiconductor device or chip, a plurality of analog and digital circuit components, and interfaces. Apparatus 300 can implement a bi-directional digital isolator that can exchange digital signals between two isolated devices through an isolation barrier. In one embodiment, apparatus 300 can be an isolator fabricated as a system IC.

Apparatus 300 can include a first chip 301 (labeled as chip 301 in FIG. 3), a second chip 302 (labeled as chip 302 in FIG. 3) and an isolation barrier 320. Each one of chips 301, 302 can be an individual IC or semiconductor chip. First chip 301 and second chip 302 can be isolated from one another (e.g., no direct or physical connection). Isolation barrier 320 can be situated between first chip 201 and second chip 202 to isolate first chip 301 and second chip 302. Isolation barrier 320 can include a plurality of isolation components or isolation elements labeled as ISO. The isolation elements in isolation barrier 320 can be, for example, capacitors or transformers. In one embodiment, first chip 301 and second chip 302 can be first chip 201 and second chip 202 shown in FIG. 2, with additional components, respectively.

First chip 301 can include N digital signal modulators labeled as modulators 310-A1, 310-A2, . . . 310-AN. First chip 301 can further include M digital signal demodulators labeled as demodulators 312-A1, 312-A2, . . . 312-AM. In one embodiment, the N modulators in first chip 301 can be PSK modulators and the M demodulator in first chip 301 can be PSK demodulators. Second chip 302 can include M digital signal modulators labeled as modulators 314-B1, 314-B2, . . . 314-BM. Second chip 302 can further include N digital signal demodulators labeled as demodulators 316-B1, 316-B2, . . . 316-BN. In one embodiment, the M modulators in second chip 302 can be PSK modulators and the N demodulator in second chip 302 can be PSK demodulators.

In one embodiment, the N modulators in first chip 301 can receive N respective input signals designated for second chip 302, labeled as Input-A1, Input-A2, . . . ,Input-AN. First chip 301 can receive carrier signal 232 and distribute carrier signal 232 to the N modulators in first chip 301. The N modulators in first chip 301 can modulate carrier signal 232 using the N input signals designated for second chip 302 to generate N modulated signals, and transmit the N modulated signals to the N demodulators in second chip 302 through respective isolation elements in isolation barrier 320. First chip 301 can transmit carrier signal 232 to second chip 302, and second chip 302 can receive carrier signal 232 as delayed carrier signal 234. Second chip 302 can distribute delayed carrier signal 234 to the N demodulators in second chip 302 and to the M modulators in second chip 302. The N demodulators in second chip 302 can use delayed carrier signal 234 to demodulate the N modulated signals received from first chip 301 to generate N output signals labeled as Output-B1, Output-B2, . . . ,Output-BN.

The M modulators in second chip 302 can receive M respective input signals designated for first chip 301, labeled as Input-B1, Input-B2, . . . ,Input-BM. The M modulators in second chip 302 can modulate delayed carrier signal 234 using the M input signals designated for first chip 301 to generate M modulated signals, and transmit the M modulated signals to the M demodulators in first chip 301 through respective isolation elements in isolation barrier 320. Second chip 302 can transmit delayed carrier signal 234 to first chip 301, and first chip 301 can receive delayed carrier signal 234 as twice delayed carrier signal 236. First chip 301 can distribute twice delayed carrier signal 236 to the M demodulators in first chip 301. The M demodulators in first chip 301 can use twice delayed carrier signal 236 to demodulate the M modulated signals received from second chip 302 to generate M output signals labeled as Output-A1, Output-A2, . . . ,Output-AM.

As shown by the embodiment in FIG. 3, the methods described herein to re-use carrier signal 232 can be applicable to isolation systems that include multiple forward paths (e.g., from first chip 301 to second chip 302) and multiple return paths (e.g., from second chip 302 to first chip 301).

Figure 4:
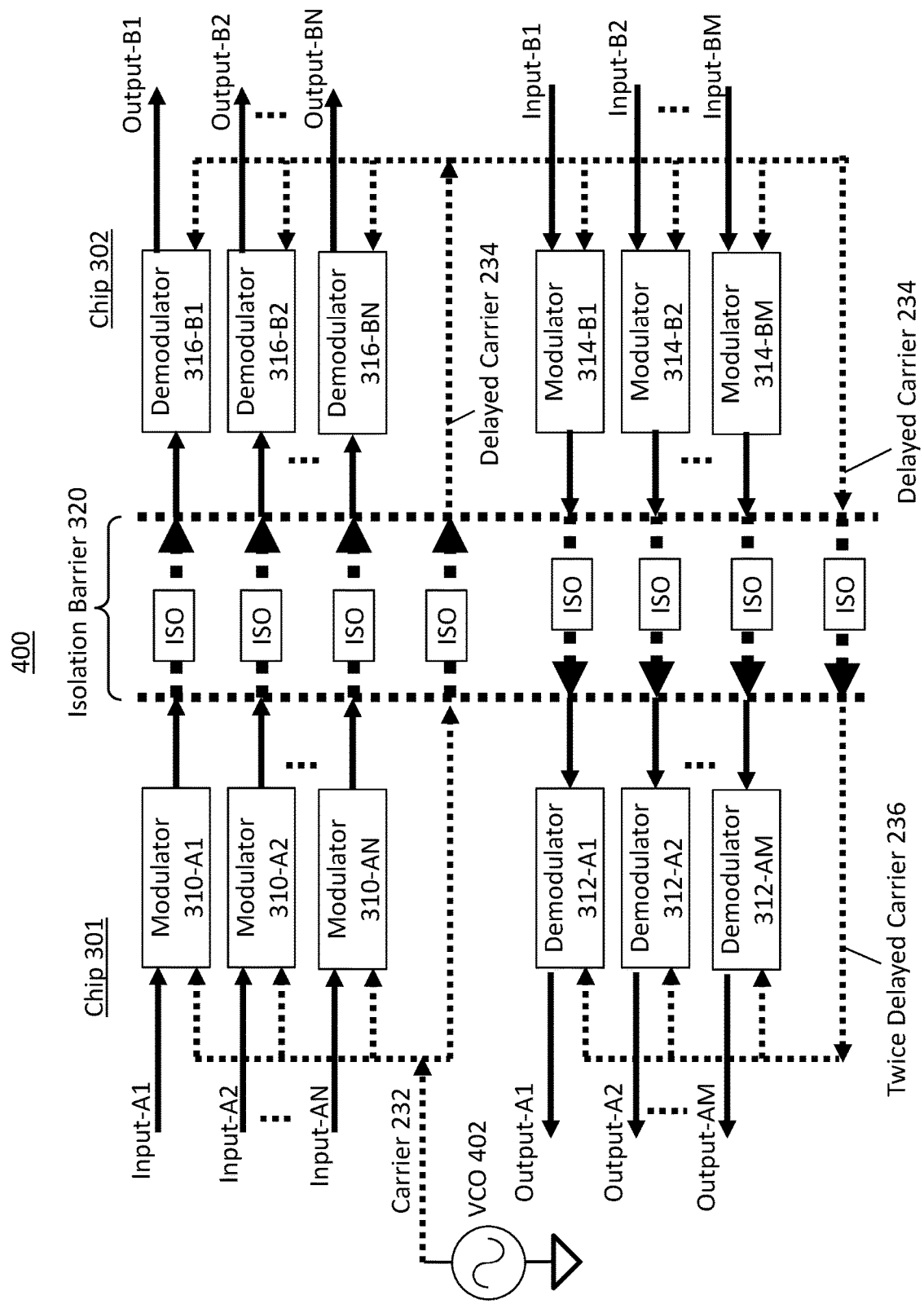
FIG. 4 is another example diagram of an isolator with forward and return paths in one embodiment.

FIG. 4 is another example diagram of an isolator with forward and return paths in one embodiment. An apparatus 400 is shown in FIG. 4. In one embodiment, apparatus 400 can be apparatus 300, shown in FIG. 3, with additional components. Apparatus 400, when compared to apparatus 300, can further include a voltage controlled oscillator (VCO) 402 configured to generate carrier signal 232. In one embodiment, apparatus 400 can be an isolator fabricated as a system IC. VCO 402 can distribute carrier signal 232 to the N modulators in first chip 301. When carrier signal 232 is generated by a VCO, such as VCO 402, carrier signal 232 can be a spread spectrum carrier signal. Using a VCO to generate a spread spectrum carrier signal can minimize electromagnetic interference (EMI) emission.

Figure 5:
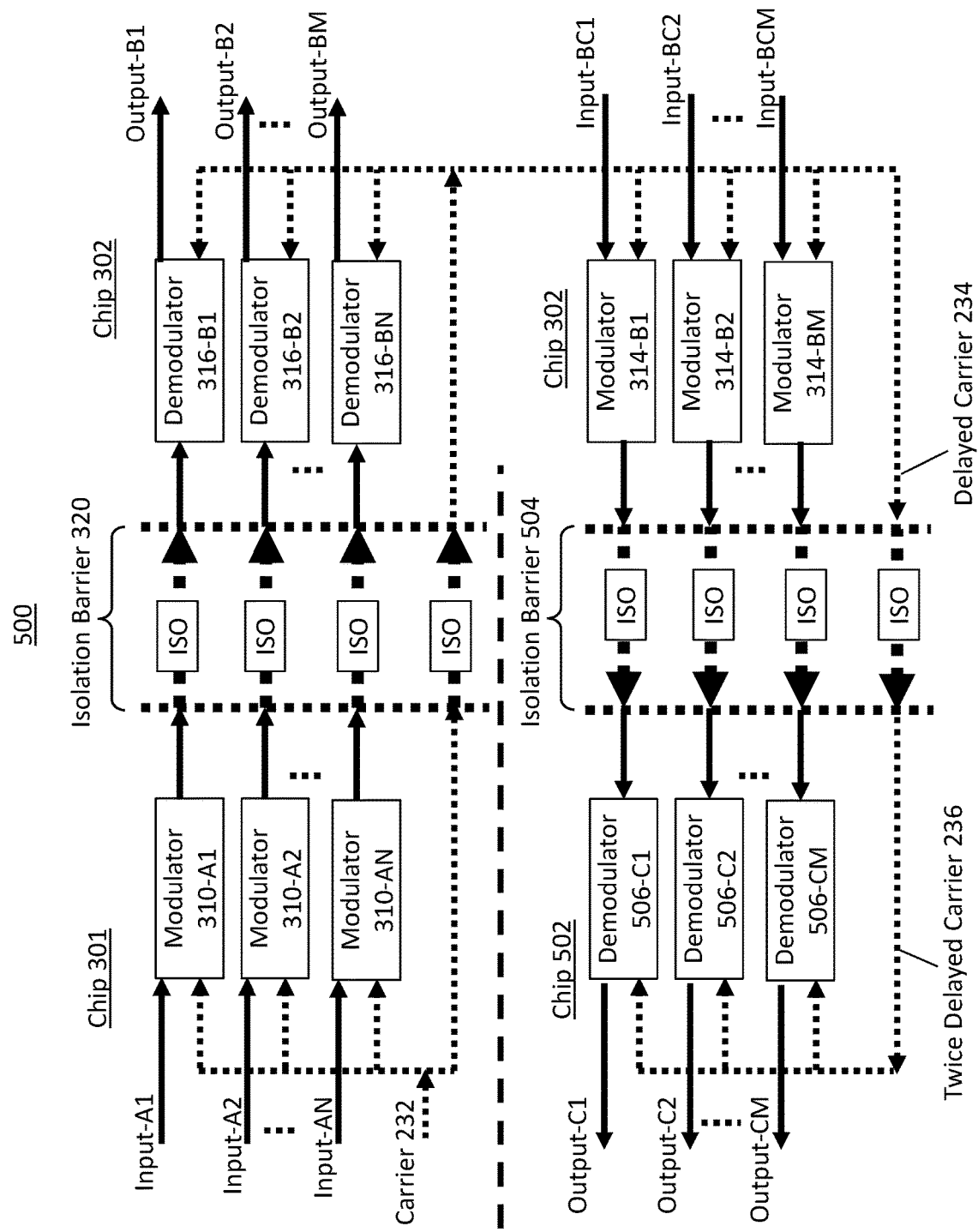
FIG. 5 is another example diagram of an isolator with forward and return paths in one embodiment.

FIG. 5 is another example diagram of an isolator with forward and return paths in one embodiment. An apparatus 500 is shown in FIG. 5. In one embodiment, apparatus 500 can be apparatus 300, shown in FIG. 3, with additional components. Apparatus 500, when compared to apparatus 200, can further include a third chip 502 (labeled as chip 502 in FIG. 5). Third chip 502 can be an IC or semiconductor chip. Third chip 502 can be isolated from second chip 302 (e.g., no direct or physical connection). An isolation barrier 504 can be situated between second chip 302 and third chip 502 to isolate second chip 302 and third chip 502. Isolation barrier 504 can include a plurality of isolation components or isolation elements that can be, for example, capacitors or transformers. Although four isolation elements are shown in FIG. 5, isolation barrier 504 can include an arbitrary number of isolation elements.

Third chip 502 can include M digital signal demodulators labeled as demodulators 506-C1, 506-C2, . . . 506-CM. The M demodulators in third chip 502 can be PSK demodulators. In one embodiment, the M modulators in second chip 302 can receive M respective input signals designated for third chip 502, labeled as Input-BC1, Input-BC2, . . . ,Input-BCM. The M modulators in second chip 302 can modulate delayed carrier signal 234 using the M input signals designated for third chip 502. The M demodulators in second chip 302 can transmit the M modulated signals, generated by the M modulators in second chip 302, to the M demodulators in third chip 502 through respective isolation elements in isolation barrier 504. Second chip 302 can transmit delayed carrier signal 234 to third chip 502, and third chip 502 can receive delayed carrier signal 234 as twice delayed carrier signal 236. Third chip 502 can distribute twice delayed carrier signal 236 to the M demodulators in third chip 502. The M demodulators in third chip 502 can use twice delayed carrier signal 236 to demodulate the M modulated signals received from second chip 302 to generate M output signals labeled as Output-C1, Output-C2, . . . ,Output-CM.

The isolators described herein (e.g., apparatus 200, 300, 400, 500) can be implemented in various applications, such as power modules for DC-DC and AC-DC converters, motor driver in consumer, automotive, aerospace industries, or other applications that need to transmit signals between isolated devices. The isolators described herein can support high data rate (e.g., 200 Mbps), high noise immunity (e.g., CMTI>200 kV/μsec), and external magnetic field (e.g., >800 Tesla per second). In one embodiment, the isolators described herein can be situated between master controller and driver ICs for wide band gap devices (e.g., 800 volts) such as silicon or gallium nitride (GaN) transistors. The isolators described herein can support self-align dead-time generation system for high frequency PWM (e.g., <1 MHz) control signals from the master controller, without tuning.

FIG. 6 illustrates a flow diagram relating to operations of an isolator with forward and return paths in one embodiment. The process 600 in FIG. 6 may be performed for operating isolators, such as apparatus 200, 300, 400, 500, discussed above. The process 600 can include one or more operations, actions, or functions as illustrated by one or more of blocks 602, 604, 606, 608 and/or 610. Although illustrated as discrete blocks, various blocks may be divided into additional blocks, combined into fewer blocks, eliminated, performed in different order, or performed in parallel, depending on the desired implementation.

Process 600 can begin at block 602. At block 602, a first chip of an isolator can modulate a carrier signal using a first signal to generate a first modulated signal. In one embodiment, the first chip can operate a voltage controlled oscillator to generate the carrier signal. Process 600 can proceed from block 602 to block 604. At block 604, the first chip can transmit the carrier signal and the first modulated signal through a forward path in an isolation barrier, where transmitting the carrier signal through the isolation barrier can transform the carrier signal into a delayed carrier signal.

Process 600 can proceed from block 604 to block 606. At block 606, a second chip of the isolator can demodulate the first modulated signal to recover the first signal. Process 600 can proceed from block 606 to block 608. At block 608, the second chip can modulate the delayed carrier signal using a second signal to generate a second modulated signal. Process 600 can proceed from block 608 to block 610. At block 610, the second chip can transmit the delayed carrier signal and the second modulated signal through a return path in the isolation barrier, where the return path and the forward path has opposite directions.

In one embodiment, the first chip can transmit the carrier signal through the forward path by transmitting the carrier signal through a first isolation component of the isolation barrier. The first chip can transmit the first modulated signal through the forward path by transmitting the first modulated signal through a second isolation component of the isolation barrier. The second chip can transmit the delayed carrier signal through the return path by transmitting the delayed carrier signal through a third isolation component of the isolation barrier. The second chip can transmit the second modulated signal through the return path by transmitting the second modulated signal through a fourth isolation component of the isolation barrier. In one embodiment, each one of the first isolation component, the second isolation component, the third isolation component and the fourth isolation component can be one of a capacitor and a transformer.

In one embodiment, the first chip can transmit the carrier signal through the forward path by applying a delay to the carrier signal to transform the carrier signal into the delayed carrier signal. The second chip can transmit the delayed carrier signal through the return path by applying the delay to the delayed carrier signal to transform the delayed carrier signal into a twice delayed carrier signal. The first chip can demodulate the twice delayed carrier signal to recover the second signal.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a first chip;
a second chip;
an isolation barrier;
the first chip being configured to:
   receive a first signal from a first device connected to the first chip, wherein the first signal is designated for a second device;
   modulate a carrier signal, using the first signal, to generate a first modulated signal; and
   transmit the carrier signal and the first modulated signal to the second chip through the isolation barrier; and
the second chip being configured to:
   receive the carrier signal and the first modulated signal, wherein the carrier signal is received as a delayed carrier signal;
   demodulate the first modulated signal to recover the first signal;
   modulate the delayed carrier signal, using a second signal designated for the first device, to generate a second modulated signal; and
   transmit the delayed carrier signal and the second modulated signal to the first chip through the isolation barrier.

2. The semiconductor device of claim 1, wherein:
the isolation barrier includes a first isolation component, a second isolation component, a third isolation component, and a fourth isolation component;
the first chip is configured to transmit the carrier signal to the second chip through the first isolation component;
the first chip is configured to transmit the first modulated signal to the second chip through the second isolation component;
the second chip is configured to transmit the delayed carrier signal to the first chip through the third isolation component; and
the second chip is configured to transmit the second modulated signal to the first chip through the fourth isolation component.

3. The semiconductor device of claim 2, wherein each one of the first isolation component, the second isolation component, the third isolation component and the fourth isolation component is one of a capacitor and a transformer.

4. The semiconductor device of claim 2, wherein:
the first chip includes N digital signal modulators;
the first isolation component and the second isolation component are among N isolation components that transfers signals from the first chip to the second chip;
the second chip includes M digital signal modulators; and
the third isolation component and the fourth isolation component are among M isolation components that transfers signals from the second chip to the first chip.

5. The semiconductor device of claim 1, wherein:
the first chip includes:
   N digital signal modulators; and
   M digital signal demodulators;
the second chip includes:
   N digital signal demodulators; and
   M digital signal modulators;
the first chip is configured to distribute the carrier signal to the N digital signal modulators in the first chip;
the second chip is configured to distribute the delayed carrier signal to the M digital signal modulators in the second chip; and
the second chip is configured to transmit the delayed carrier signal to the M digital signal demodulators in the first chip.

6. The semiconductor device of claim 1, wherein the carrier signal is a spread spectrum signal generated by a voltage controlled oscillator.

7. The semiconductor device of claim 1, wherein:
the isolation barrier applies a delay to the carrier signal to transform the carrier signal into the delayed carrier signal;
the isolation barrier applies the delay to the delayed carrier signal to transform the delayed carrier signal into a twice delayed carrier signal; and
the first chip is configured to:
   receive the twice delayed carrier signal; and
   demodulate the twice delayed carrier signal to recover the second signal.

8. The semiconductor device of claim 1, further comprising:
a third chip; and
the second chip is further configured to:
   receive a third signal designated for the third chip;
   modulate the delayed carrier signal using the third signal to generate a third modulated signal; and
   transmit the delayed carrier signal and the third modulated signal to the third chip through the isolation barrier.

9. A method for transmitting a signal, the method comprising:
receiving a first signal from a first device, wherein the first signal is designated for a device;
modulating a carrier signal using the first signal to generate a first modulated signal;
transmitting the carrier signal and the first modulated signal through a forward path in an isolation barrier, wherein transmitting the carrier signal through the isolation barrier transforms the carrier signal into a delayed carrier signal;
demodulating the first modulated signal to recover the first signal;
modulating the delayed carrier signal using a second signal designated for another device to generate a second modulated signal; and
transmitting the delayed carrier signal and the second modulated signal through a return path in the isolation barrier, wherein the return path and the forward path has opposite directions.

10. The method of claim 9, wherein:
transmitting the carrier signal through the forward path comprises transmitting the carrier signal through a first isolation component of the isolation barrier;
transmitting the first modulated signal through the forward path comprises transmitting the first modulated signal through a second isolation component of the isolation barrier;
transmitting the delayed carrier signal through the return path comprises transmitting the delayed carrier signal through a third isolation component of the isolation barrier; and
transmitting the second modulated signal through the return path comprises transmitting the second modulated signal through a fourth isolation component of the isolation barrier.

11. The method of claim 10, wherein each one of the first isolation component, the second isolation component, the third isolation component and the fourth isolation component is one of a capacitor and a transformer.

12. The method of claim 9, further comprising operating a voltage controlled oscillator to generate the carrier signal.

13. The method of claim 9, wherein:
transmitting the carrier signal through the forward path comprises applying a delay to the carrier signal to transform the carrier signal into the delayed carrier signal;
transmitting the delayed carrier signal through the return path comprises applying the delay to the delayed carrier signal to transform the delayed carrier signal into a twice delayed carrier signal; and
the method further comprising demodulating the twice delayed carrier signal to recover the second signal.

14. A semiconductor device comprising:
a first device;
a second device; and
an isolator including:
a first chip;
a second chip;
an isolation barrier;
the first chip being configured to:
receive a first signal from the first device, wherein the first signal is designated for the second device;
modulate a carrier signal using the first signal to generate a first modulated signal; and
transmit the carrier signal and the first modulated signal to the second chip through the isolation barrier;
the second chip being configured to:
receive the carrier signal and the first modulated signal, wherein the carrier signal is received as a delayed carrier signal;
demodulate the first modulated signal to recover the first signal;
receive a second signal from the second device, wherein the second signal is designated for the first device;
modulate the delayed carrier signal using the second signal to generate a second modulated signal; and
transmit the delayed carrier signal and the second modulated signal to the first chip through the isolation barrier; and
the first chip is further configured to:
receive the delayed carrier signal as a twice delayed carrier signal;
demodulate the twice delayed carrier signal to recover the second signal; and
transmit the second signal to the first device.

15. The semiconductor device of claim 14, wherein:
the isolation barrier includes a first isolation component, a second isolation component, a third isolation component, and a fourth isolation component;
the first chip is configured to transmit the carrier signal to the second chip through the first isolation component;
the first chip is configured to transmit the first modulated signal to the second chip through the second isolation component;
the second chip is configured to transmit the delayed carrier signal to the first chip through the third isolation component; and
the second chip is configured to transmit the second modulated signal to the first chip through the fourth isolation component.

16. The semiconductor device of claim 15, wherein each one of the first isolation component, the second isolation component, the third isolation component and the fourth isolation component is one of a capacitor and a transformer.

17. The semiconductor device of claim 15, wherein:
the first chip includes N digital signal modulators;
the first isolation component and the second isolation component are among N isolation components that transfers signals from the first chip to the second chip;
the second chip includes M digital signal modulators; and
the third isolation component and the fourth isolation component are among M isolation components that transfers signals from the second chip to the first chip.

18. The semiconductor device of claim 14, wherein:
the first chip includes:
N digital signal modulators; and
M digital signal demodulators;
the second chip includes:
N digital signal demodulators; and
M digital signal modulators;
the first chip is configured to distribute the carrier signal to the N digital signal modulators in the first chip;
the second chip is configured to distribute the delayed carrier signal to the M digital signal modulators in the second chip; and
the second chip is configured to transmit the delayed carrier signal to the M digital signal demodulators in the first chip.

19. The semiconductor device of claim 14, wherein the first device comprises a voltage controlled oscillator configured to generate the carrier signal.

20. The semiconductor device of claim 14, wherein:
the isolation barrier applies a delay to the carrier signal to transform the carrier signal into the delayed carrier signal; and
the isolation barrier applies the delay to the delayed carrier signal to transform the delayed carrier signal into the twice delayed carrier signal.

* * * * *